US009554454B2

(12) United States Patent
Zhao et al.

(10) Patent No.: US 9,554,454 B2
(45) Date of Patent: Jan. 24, 2017

(54) DEVICES AND METHODS TO REDUCE DIFFERENTIAL SIGNAL PAIR CROSSTALK

(71) Applicant: Intel Corporation, Santa Clara, CA (US)

(72) Inventors: Chong Richard Zhao, West Linn, OR (US); Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 14/573,434

(22) Filed: Dec. 17, 2014

(65) Prior Publication Data

US 2016/0181682 A1 Jun. 23, 2016

(51) Int. Cl.
*H05K 1/11* (2006.01)
*H01P 3/02* (2006.01)
*H05K 1/02* (2006.01)

(52) U.S. Cl.
CPC ............. *H05K 1/0216* (2013.01); *H01P 3/026* (2013.01); *H05K 1/111* (2013.01); *H05K 1/115* (2013.01)

(58) Field of Classification Search
CPC .......... H01L 23/50; H01L 2224/73204; H01L 23/49838; H01L 23/49827; H01L 23/5286; H01L 23/66; H01L 24/16; H01L 24/48; H01L 2223/6638; H05K 1/0245; H05K 1/0219; H05K 2201/09227; H05K 1/112
USPC ................. 174/261, 255; 257/697, 773, 698, 257/E23.07, E23.151; 333/260
See application file for complete search history.

(56) References Cited

U.S. PATENT DOCUMENTS

| | | | | |
|---|---|---|---|---|
| 6,641,411 B1 * | 11/2003 | Stoddard | ........... | H01L 23/49838 257/E23.07 |
| 7,095,107 B2 * | 8/2006 | Ramakrishnan | .. | H01L 23/49838 257/691 |
| 8,232,480 B2 * | 7/2012 | Liu | ................... | H01L 23/49838 174/261 |
| 8,319,345 B2 * | 11/2012 | Abe | ...................... | H01L 23/481 257/730 |
| 8,552,301 B2 * | 10/2013 | Kusaka | ............. | H01L 23/49827 174/255 |

(Continued)

FOREIGN PATENT DOCUMENTS

| CN | 103929877 A | 7/2014 |
|---|---|---|
| EP | 2755457 A1 | 7/2014 |

(Continued)

OTHER PUBLICATIONS

"Japanese Application Serial No. 2015-222890, Office Action mailed Sep. 13, 2016", W/ English Translation, 9 pgs.

*Primary Examiner* — Dean Takaoka
*Assistant Examiner* — Alan Wong
(74) *Attorney, Agent, or Firm* — Schwegman Lundberg & Woessner, P.A.

(57) ABSTRACT

Generally discussed herein are systems, apparatuses, and methods that relate to reducing crosstalk in a differential signal pair. According to an example, a device may include a first pair of differential signal lines comprising a first signal line and a second signal line proximate the first signal line, the first signal line and the second signal line separated from each other along a first line, and a second pair of differential signal lines comprising a third signal line proximate a fourth signal, the third signal line and the fourth signal separated from each other along a second line generally perpendicular to the first line.

13 Claims, 7 Drawing Sheets

(56) References Cited

U.S. PATENT DOCUMENTS

| | | | |
|---|---|---|---|
| 8,555,230 B2* | 10/2013 | Catuogno | G06F 17/5068 716/126 |
| 2005/0121766 A1* | 6/2005 | Devnani | H01L 23/49822 257/691 |
| 2006/0121749 A1 | 6/2006 | Fogg | |
| 2010/0193945 A1* | 8/2010 | Hochstenbach | H01L 23/3192 257/737 |
| 2011/0168433 A1 | 7/2011 | Kusaka | |
| 2014/0197899 A1 | 7/2014 | Kawai | |

FOREIGN PATENT DOCUMENTS

| | | |
|---|---|---|
| JP | 2011146484 A | 7/2011 |
| JP | 2014138015 A | 7/2014 |
| KR | 1020140092212 A | 7/2014 |
| TW | 201429352 A | 7/2014 |
| TW | 201629991 A | 8/2016 |

* cited by examiner

DEVICES AND METHODS TO REDUCE DIFFERENTIAL SIGNAL PAIR CROSSTALK

TECHNICAL FIELD

Embodiments in this disclosure generally relate to devices and methods for reducing crosstalk between differential signal pairs.

BACKGROUND

Routing in a die and on a Printed Circuit Board (PCB) may be quite complex. Difficulties encountered in routing include managing functional blocks of a circuit or die, different functional blocks running at different frequencies and creating crosstalk, signal degradation, such as high frequency signal degradation, and providing a sufficient ground plane to help in stabilizing sensitive signals, among others. A problem that may cause an error in circuit operation includes crosstalk between differential signal pairs. As electric and electronic components become able to resolve finer differences in a signal, it may become more important to reduce crosstalk between signal lines in a die or a PCB.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Embodiments in this disclosure relate generally to reducing crosstalk in a differential signal pair. Methods, systems, or devices in accord with this disclosure may help in reducing the crosstalk between vias, pads, or traces on a PCB or within a chip, among other signal lines.

For a differential signal pair, a signal line in a package or a PCB may pick up noise from another signal line in the package or PCB, such as other nearby differential signal pair signal lines. A PCB may include one or more layers. A layer of the PCB may include a ground potential reference voltage plane. As the frequency requirements for signals in a package or board increase, crosstalk between differential signal pairs may become a bigger problem.

Crosstalk is generally one or more signals on one or more signal lines (e.g., traces, vias, interconnects, pads, pinouts, etc.) creating an undesired effect on one or more other signal lines. Crosstalk may be caused by capacitive, inductive, or conductive coupling between the signal lines. Crosstalk may appear as a frequency present in one signal line, appearing in a signal line that does not normally include that frequency, thus creating additional error in the signal line.

Differential signaling is a method of conveying information in which a difference between voltages on two signal lines determines a value corresponding to the information to be transmitted. As used herein, "pair of differential signal lines" means signal lines used in a differential signaling scheme. Information conveyed using differential signaling may be more resistant to noise than other signaling techniques. This is at least in part, because noise tends to affect each signal line in a pair of differential signal lines equally, and the information to be conveyed is the potential difference between the two signal lines. Thus, if a first signal line of a differential pair has a voltage potential, v, a second signal line of the differential pair has a voltage potential, w, and a noise source adds a voltage potential, x, to the first and second signal lines of the differential pair, the potential difference between the two signal lines does not change even though the actual potential on the signal lines has changed (i.e. $|v-w|=|(v+x)-(w+x)|$). Differential signaling may be used in analog and digital signaling. Differential signaling is distinguished from single-ended signaling, where single-ended signaling conveys information using a voltage potential on a single signal line.

A previous solution to reducing crosstalk between pairs of differential signal lines includes adding ground signal lines (i.e. a signal line electrically coupled to the ground reference potential) around each differential signal pair. Such a solution increases the overall size of the package or board, which may increase cost in manufacturing. A previous solution may be based on a uniform package Ball Grid Array (BGA) pattern in which there is little or no flexibility to adjust differential signal pair to differential signal pair orientation. A previous solution may include placing pairs of differential signal lines in parallel with respect to each other and placing ground signal lines in between the pairs of differential signal lines.

Discussed herein are devices, techniques, and systems that may reduce crosstalk without adding ground signal lines around or between pairs of differential signal lines. One or more embodiments discussed herein may include a pair of differential signal lines oriented perpendicularly with respect to another pair of differential signal lines, such as without adding ground signal lines. Such embodiments can reduce the crosstalk between differential signal pairs while maintaining or reducing the package size. A simulation has been performed to investigate if the perpendicular layout of differential signal pair signal lines improves (i.e. reduces) crosstalk and the results of the simulation are presented herein.

The inventors have figured out that the crosstalk between differential signal pairs is affected by the orientation of differential signal pairs relative to one another. The inventors have also figured out that zero or near zero crosstalk between differential signal pairs may be achieved by placing the differential signal lines at about ninety degrees relative to each other. Some BGA and other package pinout technology allows the use of variable pitch or "ball anywhere" that allows for a flexible differential signal pair pinout pattern.

Figure 1A:
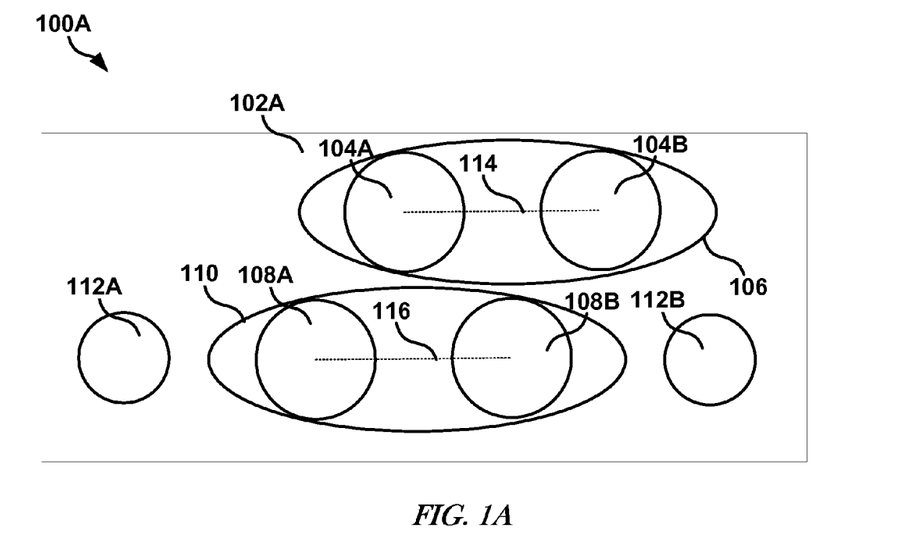
FIG. 1A illustrates, by way of example, a block diagram of a component layout.

FIG. 1A illustrates, by way of example, a block diagram of a component layout 100A. The component layout 100A may include a medium 102A, such as a die (e.g., a package), a board (e.g., a PCB), or other electrical or electronic circuit layout medium. The medium 102A specifies a size, shape, and location of conductive material and/or descriptive material to be arranged on/in the medium 102A. The layout 100A may be implemented in a physical device, such as a die or board. In the example shown in FIG. 1A, the medium 102A is a PCB layout that includes conductive material layout that includes a first pair of differential signal lines 104A and 104B and a second pair of differential signal lines 108A and 108B. The descriptive material may include text, outlines, or other material. The descriptive material may help describe a component, layout choice, assembly instruction, or designate a differential signal pair, among others. In the illustrated embodiment 100A, the descriptive material includes an outline 106 that indicates that the lines 104A and 104B are a differential signal pair, and an outline 110 that indicates that the lines 108A and 108B are a differential signal pair. The lines 112A and 112B are ground signal lines (i.e. lines that are electrically connected to a reference potential designated as ground, such as through a ground plane or other reference potential connection).

The component layout 100A includes two differential signal pairs (i.e. a first differential signal pair comprising the lines 104A-B and a second differential signal pair comprising the lines 108A-B) oriented generally parallel to each other. As used herein, a first differential signal pair being oriented parallel to a second differential pair means that a straight line connecting the centroids of the signal lines of the first differential signal pair generally parallel to a straight line connecting the centroids of the signal lines of the second differential signal pair. As used herein, a first differential signal pair being oriented perpendicular to a second differential pair means that a straight line connecting the centroids of the signal lines of the first differential signal pair is generally perpendicular to a straight line connecting the centroids of the signal lines of the second differential signal pair. "Generally parallel" and "generally perpendicular" mean parallel to within a few degrees and perpendicular to within a few degrees, respectively. The lines 114 and 116 connecting the centroids of the first differential signal pair and the second different signal pair are generally parallel to each other.

Figure 1B:
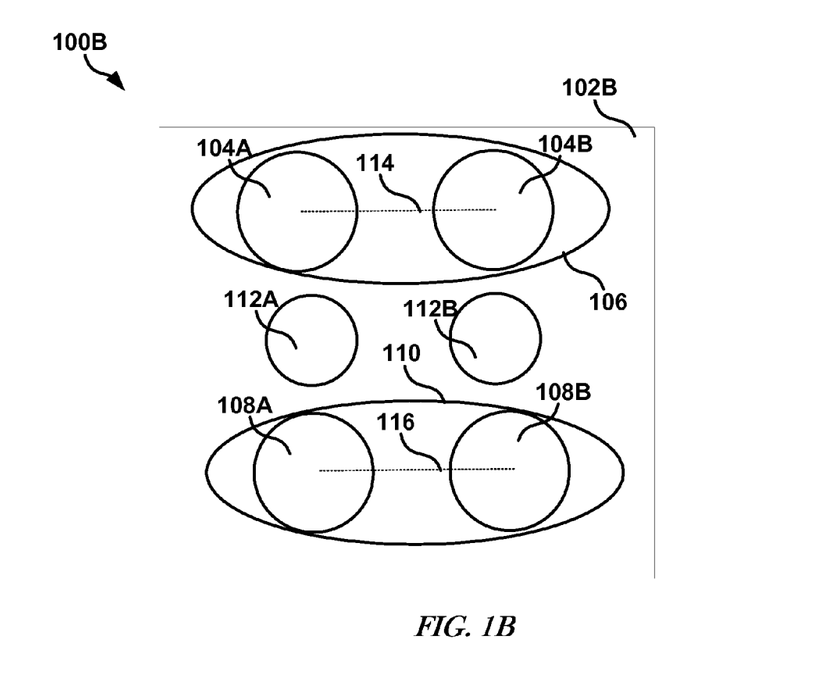
FIG. 1B illustrates another example of a block diagram of an embodiment of a component layout.

FIG. 1B illustrates another example of a block diagram of an embodiment of a component layout 100B. The component layout 100B is similar to the component layout 100A with the layout 100B including the medium 102B and ground signal lines 112A and 112B between the first pair of differential signal lines 104A-B and the second pair of differential signal lines 108A-B. The medium 102B of FIG. 1B is a PCB. Similar to the layout 100A, the lines 114 and 116 connecting the centroids of the first differential signal pair and the second different signal pair are generally parallel to each other. In contrast to the layout 100A, the first pair of differential signal lines 104A-B and second pair of differential signal lines 108A-B are separated by ground lines 112A-B. The differential signal pairs of the layout 100B may include less crosstalk than the differential signal pairs of the layout 100A. The pairs of differential signal lines of the layouts 100A-B are proximate, directly adjacent, and parallel to each other.

Figure 2:
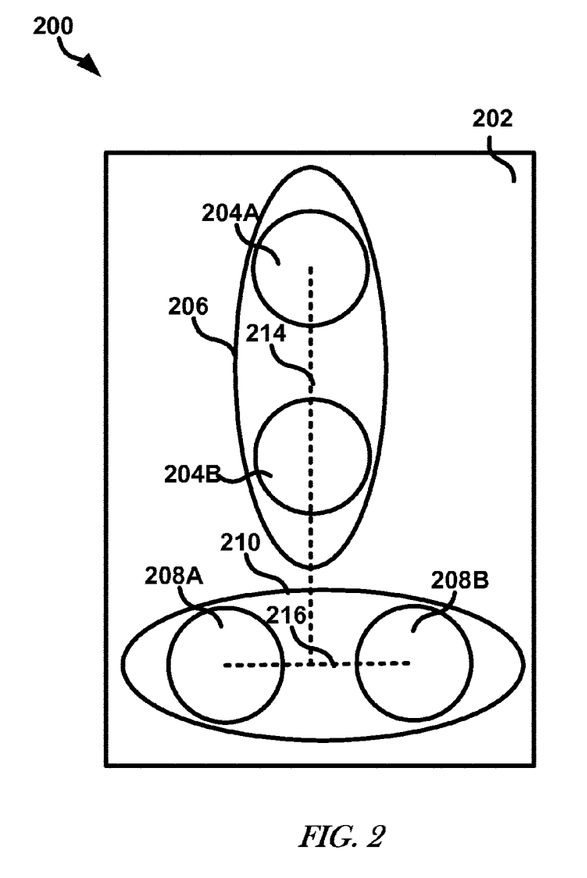
FIG. 2 illustrates, by way of example, a perspective view diagram of an embodiment of a component layout.

FIG. 2 illustrates, by way of example, a perspective view diagram of an embodiment of a component layout 200. The layout 200 as illustrated includes a medium 202, a first pair of differential signal lines 204A, and 204B and a second pair of differential signal lines 208A and 208B. The first pair of differential signal lines includes the line 204A and the line 204B that is proximate (e.g., closest or most proximate) the line 204A. The second pair of differential signal lines includes the line 208A and the line 208B that is proximate the line 208A.

The line 214 indicates an orientation between centroids of the first pair of differential signal lines 204A-B and the line 216 indicates an orientation between centroids of the second pair of differential signal lines 208A-B. The outline 206 indicates that the signal lines 204A-B are a pair of differential signal lines and the outline 210 indicates the signal lines 208A-B are another pair of differential signal lines.

The first pair of differential signal lines 204A-B is oriented generally perpendicular to the second pair of differential signal lines 208A-B (i.e. the line 214 is generally perpendicular to the line 216). The first pair of differential signal lines 204A-B is oriented such that the line 214 intersects the line 216 at about the midpoint of the line 216 (i.e. the first pair of differential signal lines 204A-B is situated along an axis about half way between the differential signal lines 208A-B). The layout 200 may include a reduced crosstalk as compared to a crosstalk between pairs of differential signal pairs of other layouts, such as the layouts 100A and 100B.

Figure 3:
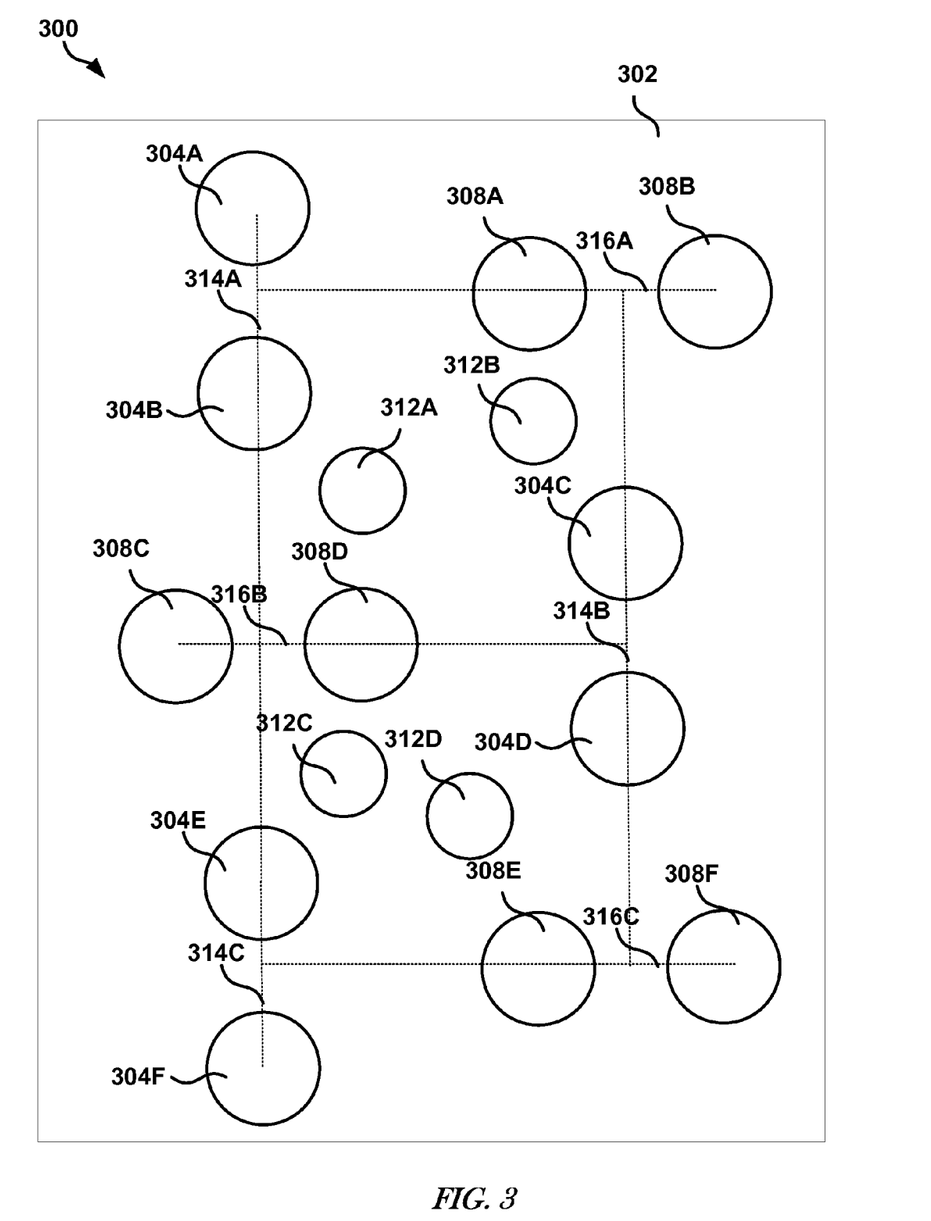
FIG. 3 illustrates, by way of example, a perspective view diagram of another embodiment of a component layout.

FIG. 3 illustrates, by way of example, a perspective view diagram of another embodiment of another component layout 300. The layout 300 as illustrated includes a medium 302. The medium 302 may be a PCB, a die (e.g., a package), or other electric or electronic circuit medium. The layout 300 as illustrated includes a first pair of differential signal lines 304A and 304B, a second pair of differential signal lines 308A and 308B, a third pair of differential signal lines 308C and 308D, a fourth pair of differential signal lines 304C and 304D, a fifth pair of differential signal lines 304E and 304F, and a sixth pair of differential signal lines 308E and 308F. The layout 300 includes a plurality of ground signal lines 312A, 312B, 312C, and 312D.

The signal line 304A and the signal line 304B are proximate each other and separated from each other along the line 314A. The line 314A connects the centroids of the signal lines 304A-B of the first pair of differential signal lines. Similarly the signal line 304C and the signal line 304D are proximate each other and separated from each other along the line 314B. The line 314B connects the centroids of the signal lines 304C-D of the fourth pair of differential signal lines. The signal line 304E and the signal line 304F are proximate each other and separated from each other along the line 314C. The line 314C connects the centroids of the signal lines 304E-F of the fifth pair of differential signal lines. The line 314C as illustrated is coextensive with the line 314A.

The signal line 308A and the signal line 308B are proximate each other and separated from each other along the line 316A. The line 316A connects the centroids of the signal lines 308A-B of the second pair of differential signal lines. Similarly the signal line 308C and the signal line 308D are proximate each other separated from each other along the line 316B. The line 316B connects the centroids of the signal lines 308C-D of the third pair of differential signal lines. The signal line 308E and the signal line 308F are proximate each other separated from each other along the line 316C. The line 316C connects the centroids of the signal lines 308E-F of the sixth pair of differential signal lines.

The first pair of differential signal lines 304A-B is oriented generally perpendicular to the second, third, and sixth pairs of differential signal lines 308A-B, 308C-D, and 308E-F (i.e. the line 314A is generally perpendicular to the lines 316A, 316B, and 316C). Similarly, the fourth pair of differential signal lines 304C-D and the fifth pair of differential signal lines 304E-F are oriented generally perpendicular to the second, third, and sixth pairs of differential signal lines 308A-B, 308C-D, and 308E-F (i.e. the lines 314B and 314C are generally perpendicular to the lines 316A, 316B, and 316C).

The second pair of differential signal lines 308A-B is oriented generally perpendicular to the first, fourth, and fifth pairs of differential signal lines 304A-B, 304C-D, and 304E-F (i.e. the line 316A is generally perpendicular to the lines 314A, 314B, and 314C). Similarly, the third pair of differential signal lines 308C-D and the sixth pair of differential signal lines 308E-F are oriented generally perpendicular to the first, fourth, and fifth pairs of differential signal lines 304A-B, 304C-D, and 304E-F (i.e. the lines 316B and 316C are generally perpendicular to the lines 314A, 314B, and 314C).

The pairs of differential signal lines 304A-B, 304C-D, 304E-F, 308A-B, 308C-D, and 308E-F may be situated such that another pair of differential signal lines proximate to a respective pair of differential signal lines 304A-B, 304C-D, 304E-F, 308A-B, 308C-D, and 308E-F is oriented generally perpendicular to the respective pair of differential signal lines 304A-B, 304C-D, 304E-F, 308A-B, 308C-D, and 308E-F. In FIG. 3, the second pair of differential signal lines 308A-B and the third pair of differential signal lines 308C-D may be proximate the first pair of differential signal lines 304A-B (i.e. closest to the first pair of differential signal lines as determined by the distance between the centers of the lines 314A and 316A, and 314A and 316B); the third pair of differential signal lines 308C-D may be proximate the first pair of differential signal lines 304A-B, the fourth pair of differential signal lines 304C-D, and the fifth pair of differential signal lines 304E-F; etc.

The pairs of differential signal lines 304A-B, 304C-D, 304E-F, 308A-B, 308C-D, and 308E-F may be situated such that another pair of differential signal lines immediately adjacent to a respective pair of differential signal lines 304A-B, 304C-D, 304E-F, 308A-B, 308C-D, and 308E-F is oriented perpendicular to the respective pair of differential signal lines 304A-B, 304C-D, 304E-F, 308A-B, 308C-D, and 308E-F. In FIG. 3, the second pair of differential signal lines 308A-B and the third pair of differential signal lines 308C-D may be immediately adjacent the first pair of differential signal lines 304A-B (i.e. closest to the first pair of differential signal lines as determined by the distance between the centers of the lines 314A and 316A, and 314A and 316B); the third pair of differential signal lines 308C-D may be immediately adjacent the first pair of differential signal lines 304A-B, the fourth pair of differential signal lines 304C-D, and the fifth pair of differential signal lines 304E-F; etc.

The pairs of differential signal lines 304A-B, 304C-D, 304E-F, 308A-B, 308C-D, and 308E-F may be situated such that there are at most four pairs of differential signal pairs within a specified radius of a midpoint of the line connecting the centroids of the pair of differential signal lines, and the pairs of differential signal lines within the radius are oriented generally perpendicular to the pair of differential signal lines 304A-B, 304C-D, 304E-F, 308A-B, 308C-D, and 308E-F. Two of the four pairs of differential signal lines may be situated on either end of the line connecting the centroids and the other two of the four pairs of the differential signal lines may be situated on either side of the midpoint of the line connecting the centroids. The pairs of differential signal lines within the radius, proximate (e.g., most proximate) to, or directly adjacent to a respective pair of differential signal lines are oriented parallel to one another.

These configurations of pairs of differential signal lines may provide sufficient space between pairs of differential signal lines that are oriented generally parallel to each other that the cross talk between them is low, negligible, or near zero. These configurations of pairs of differential signal lines may provide a reduced crosstalk between pairs of differential signal lines by orienting the proximate, directly adjacent, or pairs of differential signal lines within a specified radius of each other (e.g., where the radius is measured from a midpoint of the line connecting the centroids of the pair of differential signal lines) generally perpendicular to one another. A reduction in crosstalk may increase a bandwidth for a given channel or signal line. One or more embodiments discussed herein may also save space, such as to help reduce a package or PCB size.

Figure 4:
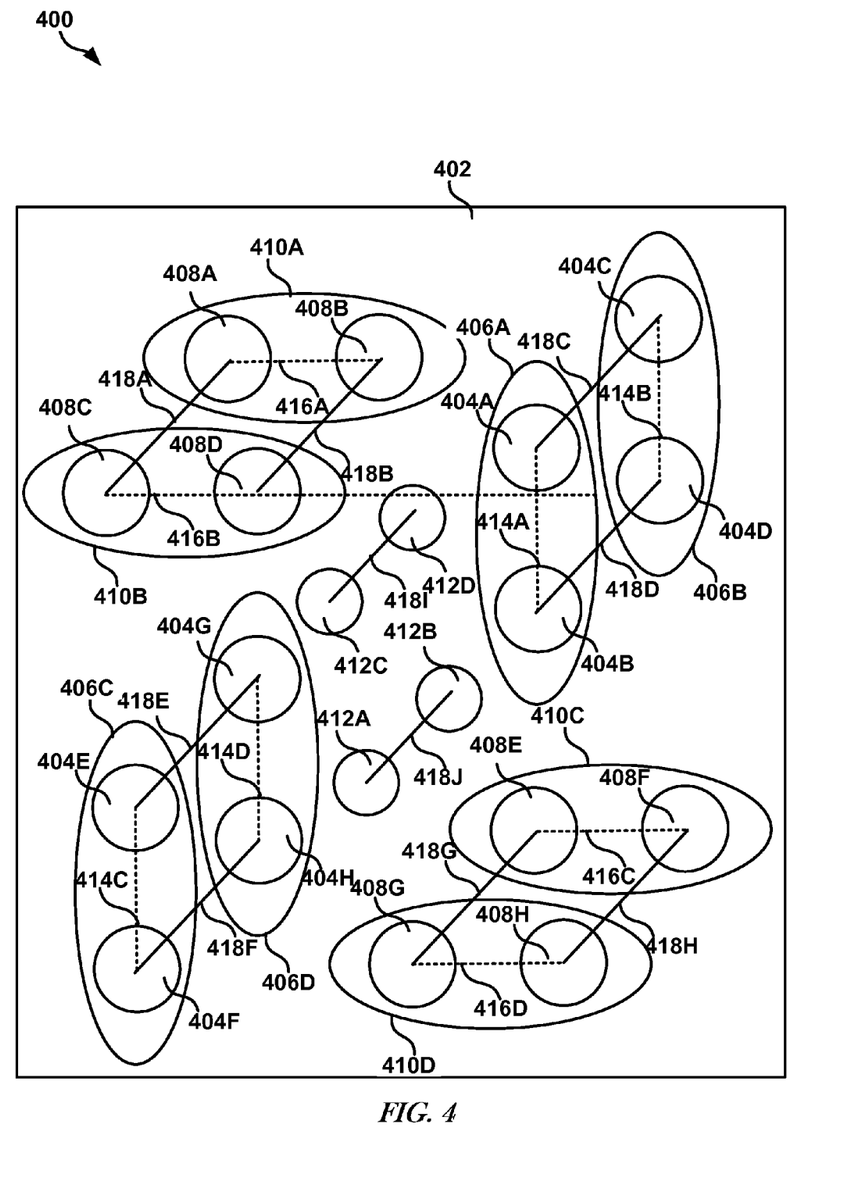
FIG. 4 illustrates, by way of example, a perspective view diagram of another embodiment of a component layout.

FIG. 4 illustrates, by way of example, a perspective view diagram of another embodiment of a component layout 400. The pairs of differential signal lines of FIG. 4 may be oriented relative to each other in a similar manner as discussed with respect to the pairs of differential signal lines of FIG. 3. The layout 400 may include a medium 402 and a plurality of pairs of differential signal lines 404A and 404B, 404C and 404D, 404E, and 404F, 404G and 404H, 408A and 408B, 408C and 408D, 408E, and 408F, and 404G and 404H arranged on/in the medium 402. The layout 400 as illustrated includes a plurality of electrical connections 418A, 418B, 418C, 418D, 418E, 418F, 418G, 418H, 418I, and 418J. The layout 400 as illustrated includes outlines 406A, 406B, 406C, 406D, 410A, 410B, 410C, and 410D.

The medium 402 specifies a size, shape, and location of conductive material and/or descriptive material to be arranged on/in the medium 402. The medium 402 may be similar to the medium 302. The medium 402 may be a PCB, a die, or other electrical or electronic component medium. In the example shown in FIG. 4, the medium 402 is a PCB layout that includes a die pinout. The descriptive material may include text, an outline, or other material. The descriptive material may help describe a component, layout choice, assembly instruction, or designate a differential signal pair, among others. In the illustrated embodiment 400, the descriptive material includes an outline 406A-D and 410A-D that indicates that the respective lines 404A and 404B, 404C and 404D, 404E, and 404F, 404G and 404H, 408A and 408B, 408C and 408D, 408E, and 408F, and 404G and 404H are pairs of differential signal lines. The signal lines 412A, 412B, 412C, and 412D are ground lines (i.e. lines that are electrically connected to a reference potential designated as ground, such as through a ground plane or other ground connection).

The differential signal lines 408A and 408B mirror the differential signal lines 408C and 408D. The differential signal lines 408A and 408B may be vias while the differential signal lines 408C and 408D are solder pads for a die, or vice versa. Since the same signal is travelling through the signal line 408C and 408A through the connection 418A, crosstalk between the lines is not a concern.

The line 416A indicates an axis on which the centroids of the signal lines 408A-B lie, and similarly the lines 416B, 416C, and 416D indicate respective axes on which the centroid of the signal lines 408C and 408D, 408E and 408F, and 408G and 408H lie, respectively. The line 414A indicates an axis on which the centroids of the signal lines 404A and 404B lie, and similarly the line 414B, 414C, and 414D indicate respective axes on which the centroid of the signal lines 404C and 404D, 404E and 404F, and 404G and 404H lie, respectively. The lines 416A, 416B, 416C, and 416D may be generally parallel to each other and generally perpendicular to the lines 414A, 414B, 414C, and 414D.

The signal lines 412A, 412B, 412C, and 412D are ground signal lines. The signal line 412B is electrically connected to the signal line 412A through the connection 418J and the signal line 412C is electrically connected to the signal line 412D through the signal line 418I.

The signal lines 408C, 408D, 404A, 404B, 404E, 404F, 408G, 408H, 412B and 412C may be vias or pads while the signal lines 408A, 408B, 404C, 404D, 404G, 404H, 408E, 408F, 412A, and 412B are pads or vias, respectively. The signal lines 408A, 408B, 404C, 404D, 404G, 404H, 408E, 408F, 412A, and 412B may "mirror" and be electrically connected to the signal lines 408C, 408D, 404A, 404B, 404E, 404F, 408G, 408H, 412B and 412C, respectively.

Figure 5:
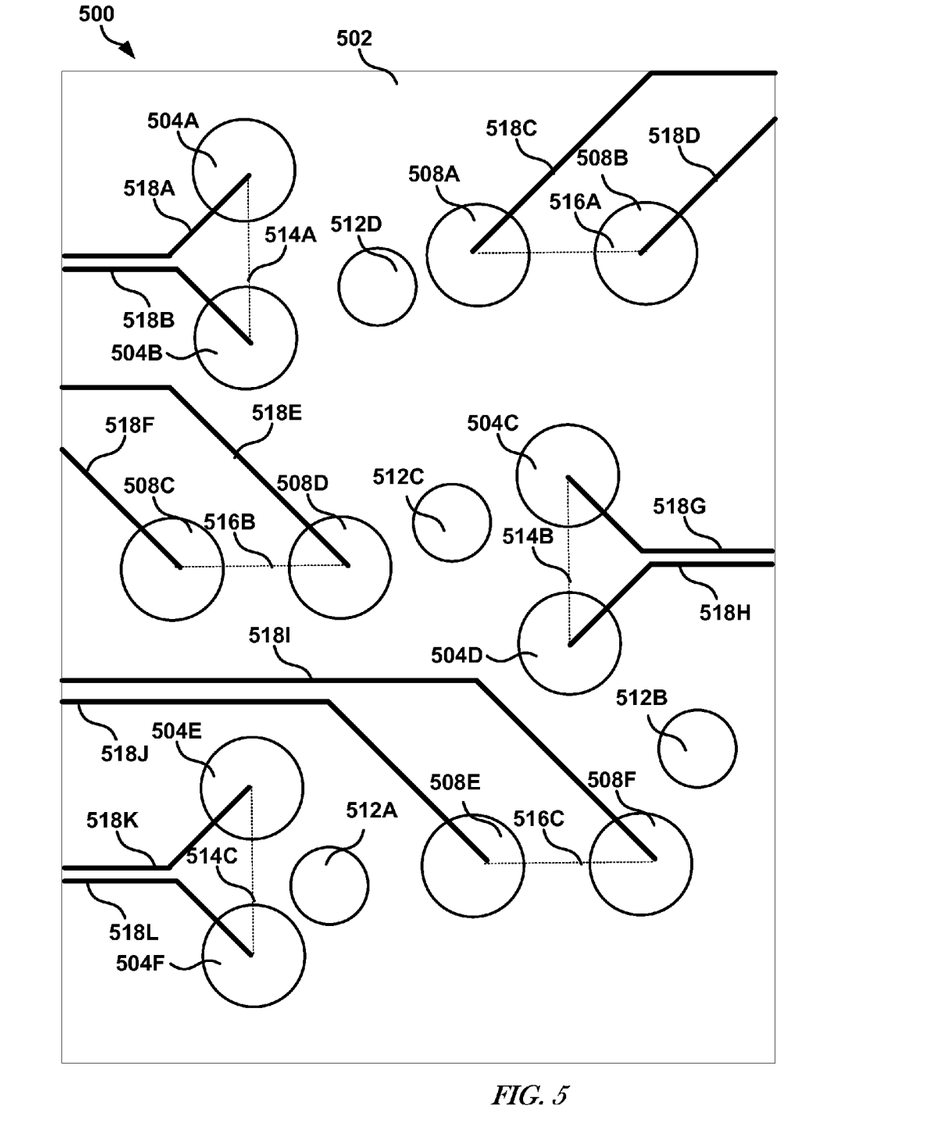
FIG. 5 illustrates, by way of example, a perspective view diagram of another embodiment of a component layout.

FIG. 5 illustrates, by way of example, a perspective view diagram of another embodiment of a component layout 500. The layout 500 is similar to the layout 300 with the layout 500 including electrical connections 518A, 518B, 518C, 518D, 518E, 518F, 518G, 518H, 518I, 518J, 518K, and 518L connected to the signal lines 504A, 504B, 508A, 508B, 508C, 508D, 504C, 504D, 508E, 508F, 504E, and 504F, respectively.

The layout 500 as illustrated includes a medium 502. The medium 502 may be a PCB, a die (e.g., a package), or other electric or electronic circuit medium. The layout 500 as illustrated includes a first pair of differential signal lines 504A and 504B, a second pair of differential signal lines 508A and 508B, a third pair of differential signal lines 508C and 508D, a fourth pair of differential signal lines 504C and 504D, a fifth pair of differential signal lines 504E and 504F, and a sixth pair of differential signal lines 508E and 508F. The layout 500 includes a plurality of ground signal lines 512A, 512B, 512C, and 512D.

The signal line 504A and the signal line 504B are proximate each other and separated from each other along the line 514A. The line 514A connects the centroids of the signal lines 504A-B of the first pair of differential signal lines. Similarly the signal line 504C and the signal line 504D are proximate each other and separated from each other along the line 514B. The line 514B connects the centroids of the signal lines 504C-D of the fourth pair of differential signal lines. The signal line 504E and the signal line 504F are proximate each other and separated from each other along the line 514C. The line 514C connects the centroids of the signal lines 504E-F of the fifth pair of differential signal lines.

The signal line 508A and the signal line 508B are proximate each other and separated from each other along the line 516A. The line 516A connects the centroids of the signal lines 508A-B of the second pair of differential signal lines. Similarly the signal line 508C and the signal line 508D are proximate each other and separated from each other along the line 516B. The line 516B connects the centroids of the signal lines 508C-D of the third pair of differential signal lines. The signal line 508E and the signal line 508F are proximate each other and separated from each other along the line 516C. The line 516C connects the centroids of the signal lines 508E-F of the sixth pair of differential signal lines.

The first pair of differential signal lines 504A-B is oriented generally perpendicular to the second, third, and sixth pairs of differential signal lines 508A-B, 508C-D, and 508E-F (i.e. the line 314A is generally perpendicular to the lines 516A, 516B, and 516C). Similarly, the fourth pair of differential signal lines 504C-D and the fifth pair of differential signal lines 504E-F are oriented perpendicular to the second, third, and sixth pairs of differential signal lines 508A-B, 508C-D, and 508E-F (i.e. the lines 514B and 514C are generally perpendicular to the lines 516A, 516B, and 516C).

The second pair of differential signal lines 508A-B is oriented generally perpendicular to the first, fourth, and fifth pairs of differential signal lines 504A-B, 504C-D, and 504E-F (i.e. the line 516A is generally perpendicular to the lines 514A, 514B, and 514C). Similarly, the third pair of differential signal lines 508C-D and the sixth pair of differential signal lines 508E-F are oriented perpendicular to the first, fourth, and fifth pairs of differential signal lines 504A-B, 504C-D, and 504E-F (i.e. the lines 516B and 516C are generally perpendicular to the lines 514A, 514B, and 514C).

The pairs of differential signal lines 504A-B, 504C-D, 504E-F, 508A-B, 508C-D, and 508E-F may be situated such that another pair of differential signal lines proximate to a respective pair of differential signal lines 504A-B, 504C-D, 504E-F, 508A-B, 508C-D, and 508E-F is oriented perpendicular to the respective pair of differential signal lines 504A-B, 504C-D, 504E-F, 508A-B, 508C-D, and 508E-F. In FIG. 5, the second pair of differential signal lines 508A-B and the third pair of differential signal lines 508C-D may be proximate the first pair of differential signal lines 504A-B (i.e. closest to the first pair of differential signal lines as determined by the distance between the centers of the lines 514A and 516A, and 514A and 516B); the third pair of differential signal lines 508C-D may be proximate the first pair of differential signal lines 504A-B, the fourth pair of differential signal lines 504C-D, and the fifth pair of differential signal lines 504E-F; etc.

The pairs of differential signal lines 504A-B, 504C-D, 504E-F, 508A-B, 508C-D, and 508E-F may be situated such that another pair of differential signal lines immediately adjacent to a respective pair of differential signal lines 504A-B, 504C-D, 504E-F, 508A-B, 508C-D, and 508E-F is oriented perpendicular to the respective pair of differential signal lines 504A-B, 504C-D, 504E-F, 508A-B, 508C-D, and 508E-F. In FIG. 5, the second pair of differential signal lines 508A-B and the third pair of differential signal lines 508C-D may be immediately adjacent the first pair of differential signal lines 504A-B (i.e. closest to the first pair of differential signal lines as determined by the distance between the centers of the lines 514A and 516A, and 514A and 516B); the third pair of differential signal lines 508C-D may be immediately adjacent the first pair of differential signal lines 504A-B, the fourth pair of differential signal lines 504C-D, and the fifth pair of differential signal lines 504E-F; etc.

The pairs of differential signal lines 504A-B, 504C-D, 504E-F, 508A-B, 508C-D, and 508E-F may be situated such that there are at most four pairs of differential signal pairs within a specified radius of a midpoint of the line connecting the centroids of the pair of differential signal lines, and the pairs of differential signal lines within the radius are oriented generally perpendicular to the pair of differential signal lines 504A-B, 504C-D, 504E-F, 508A-B, 508C-D, and 508E-F. Two of the four pairs of differential signal lines may be situated on either end of the line connecting the centroids and the other two of the four pairs of the differential signal lines may be situated on either side of the midpoint of the line connecting the centroids. The pairs of differential signal lines within the radius, proximate (e.g., most proximate) to, or directly adjacent to a respective pair of differential signal lines are oriented parallel to one another.

The component layout 200, 300, 400, or 500 may be implemented in a device, such as a PCB, die (e.g., a package), a semiconductor substrate, or other electrical or electronic component medium. The component layout 200, 300, 400, or 500 may be created using a computer program, such as a routing program, a layout program, or other program. The medium include a pin grid array (PGA), a BGA package, a Land Grid Array (LGA) package, a dual in-line package (DIP), a leadless chip carrier (LCC), a quad flat pack (QFP), a thin small outline package (TSOP), a system in package (SIP), a multi-chip module (MCM), a system on chip (SoC), or other package structure.

Two signal lines being "proximate" one another means that no other signal line is closer to the signal lines that are proximate one another. For example, if the signal lines are vias, no other vias is closer to either via than the vias that are proximate one another.

Figure 6:
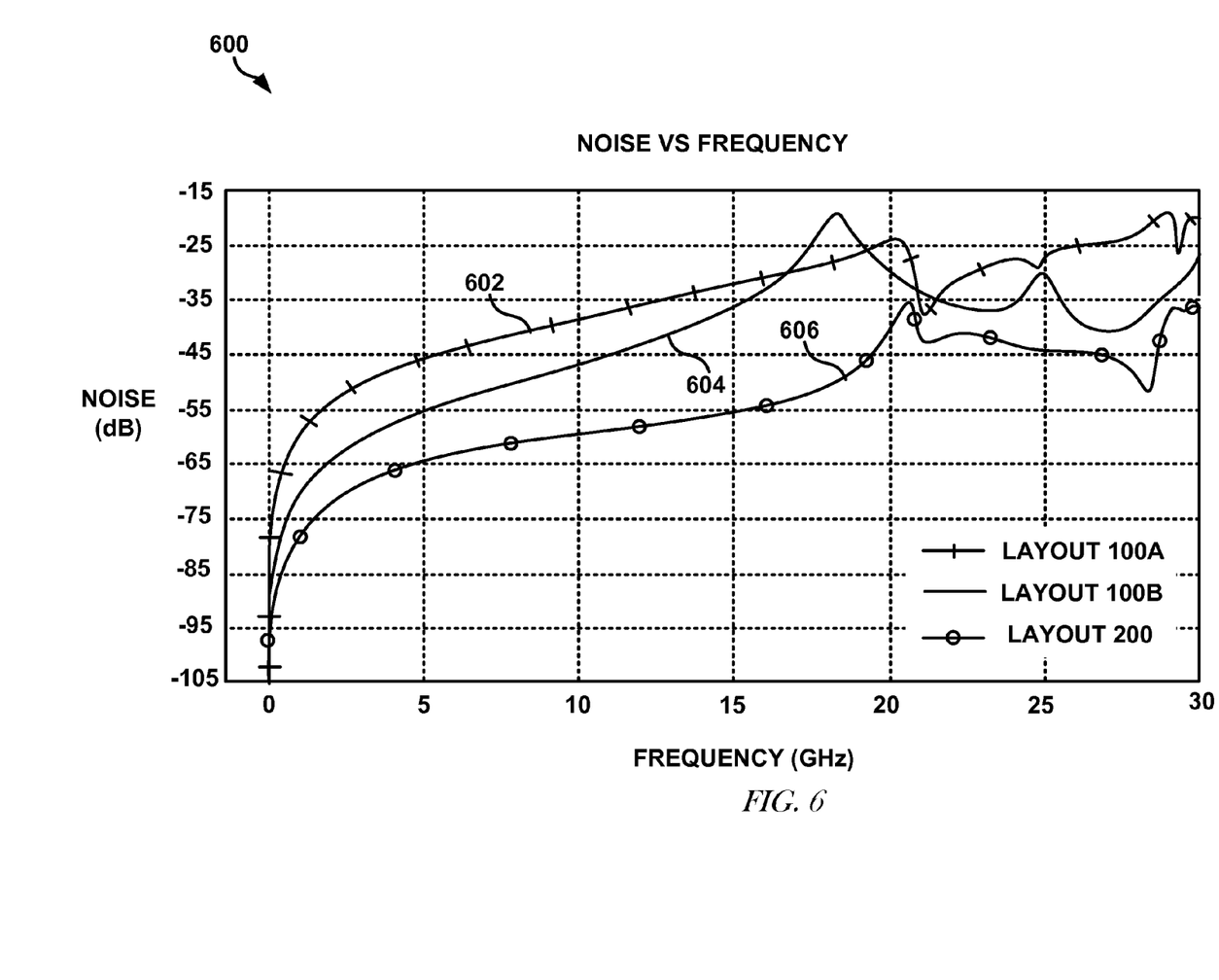
FIG. 6 illustrates, by way of example, a graph of noise versus frequency for various component layouts.

FIG. 6 illustrates, by way of example, a graph 600 of noise versus frequency for various component layouts 100A, 100B, and 200. The graph 600 was produced by simulating noise (crosstalk) in the various layouts 100A, 100B, and 200. The graph 600 shows that the noise level in decibels is lower for the layout 200 for all frequencies up to thirty Gigahertz (as simulated).

Figure 7:
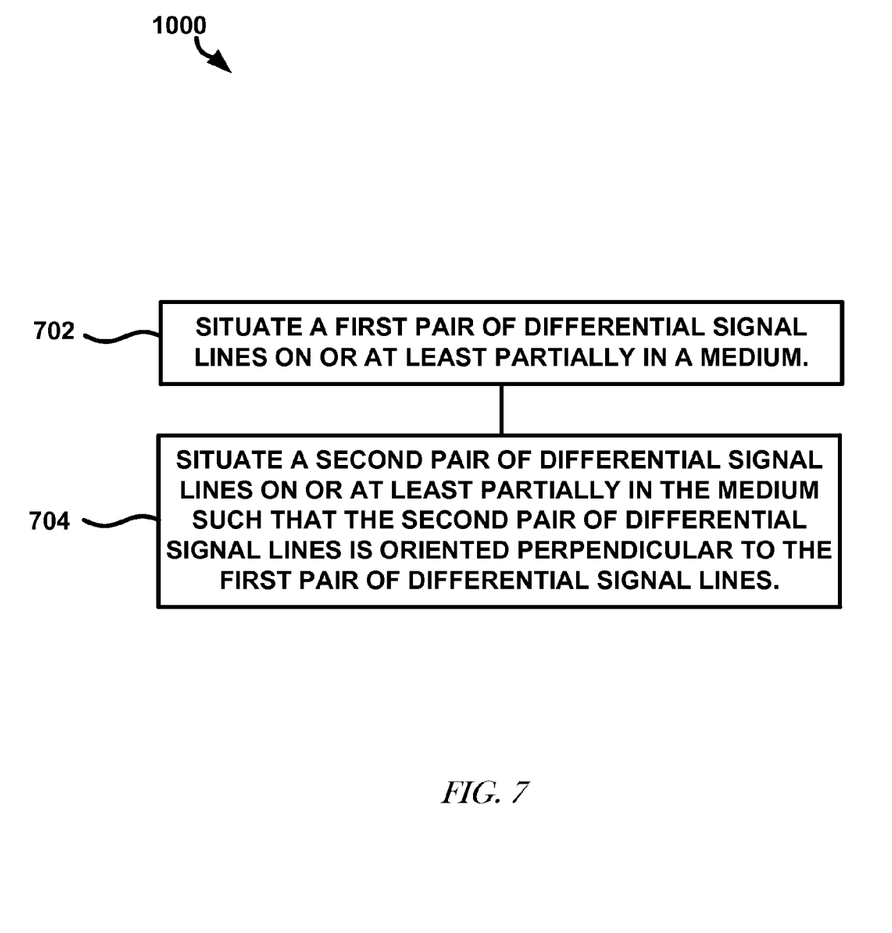
FIG. 7 illustrates, by way of example, a flow diagram of an embodiment of a method.

FIG. 7 illustrates, by way of example, a flow diagram of an embodiment of a method. The method 700 as illustrated includes: situating a first pair of differential signal lines on or at least partially in a medium at operation 702, and situating a second pair of differential signal lines on or at least partially in the medium such that the second pair of differential signal lines is oriented perpendicular to the first pair of differential signal lines at operation 704. The first pair of differential signal lines may include a first signal line proximate a second signal line. The first signal and the second signal line separated from each other along a first line. The second pair of differential signal lines may include a third signal line proximate a fourth signal line. The third signal line and the fourth signal line may be separated from each other along a second line generally perpendicular to the first line.

The method 700 may include situating a third pair of differential signal lines comprising a fifth signal proximate a sixth signal on or at least partially in the medium, the fifth signal and the sixth signal line separated from each other along a third line generally parallel to the first line and generally perpendicular to the second line. The method 700 may include situating a fourth pair of differential signal lines comprising a seventh signal line proximate an eighth signal line on or at least partially in the medium, the seventh signal and the eighth signal separated from each other along a fourth line generally perpendicular to the first line, generally parallel to the second line, and generally perpendicular to the third line. The method 700 may include situating a third pair of differential signal lines including a fifth signal line and a sixth signal line on or at least partially in the medium, wherein the fifth and sixth signal lines are separated from each other along a line parallel to the first line. The method 700 may include electrically coupling the fifth signal line to the first signal line and the sixth signal line to the second signal line.

Examples and Notes

The present subject matter may be described by way of several examples.

Example 1 may include or use subject matter (such as an apparatus, a method, a means for performing acts, or a device readable memory including instructions that, when performed by the device, may cause the device to perform acts), such as may include or use a first pair of differential signal lines comprising a first signal line and a second signal line proximate the first signal line, the first signal line and the second signal line separated from each other along a first line; and a second pair of differential signal lines comprising a third signal line proximate a fourth signal, the third signal line and the fourth signal separated from each other along a second line generally perpendicular to the first line.

Example 2 may include or use, or may optionally be combined with the subject matter of Example 1 to include or use, wherein the first line connects the centroids of the first and second signal lines and intersects the second line between the third and fourth signal lines.

Example 3 may include or use, or may optionally be combined with the subject matter of at least one of Examples 1-2 to include or use a third pair of differential signal lines comprising a fifth signal line proximate a sixth signal line, the fifth signal line and the sixth signal line separated from each other along a third line generally parallel to the first line and generally perpendicular to the second line.

Example 4 may include or use, or may optionally be combined with the subject matter of Example 3 to include or use, wherein the second line connects the centroids of the third and fourth signal lines and intersects the third line between the fifth and sixth signal lines.

Example 5 may include or use, or may optionally be combined with the subject matter of at least one of Examples 3-4 to include or use a fourth pair of differential signal lines comprising a seventh signal line proximate an eighth signal line, the seventh signal line and the eighth signal line separated from each other along a fourth line generally perpendicular to the first line, generally parallel to the second line, and generally perpendicular to the third line.

Example 6 may include or use, or may optionally be combined with the subject matter of Example 5 to include or use, wherein the fourth line connects the centroids of the seventh and eighth signal lines and intersects the first line between the first and second signal lines.

Example 7 may include or use, or may optionally be combined with the subject matter of at least one of Examples 5-6 to include or use one or more ground signal lines situated in a region between the first, second, third, and fourth pairs of differential signal lines.

Example 8 may include or use, or may optionally be combined with the subject matter of at least one of Examples 1-7 to include or use, wherein the device includes a memory device.

Example 9 may include or use, or may optionally be combined with the subject matter of at least one of Examples 1-8 to include or use, wherein the first and second pairs of differential signal lines are configured in a Ball Grid Array (BGA) pinout pattern.

Example 10 may include or use, or may optionally be combined with the subject matter of at least one of Examples 1-2 to include or use a third pair of differential signal lines including a fifth signal line electrically coupled to the first signal line and a sixth signal line electrically coupled to the second signal line, wherein the fifth and sixth signal lines are separated from each other along a line parallel to the first line.

Example 11 may include or use, or may optionally be combined with the subject matter of at least one of Examples 1-10 to include or use, wherein the first pair of differential signal lines are first and second vias.

Example 12 may include or use, or may optionally be combined with the subject matter of at least one of Examples 1-10 to include or use, wherein the first pair of differential signal lines are first and second solder pads.

Example 13 may include or use subject matter (such as an apparatus, a method, a means for performing acts, or a device readable memory including instructions that, when performed by the device, may cause the device to perform acts), such as may include or use a PCB comprising a first plurality of pairs of differential signal solder pads, wherein each pair of differential signal solder pads of the first plurality of differential signal solder pads includes a first pad separated from a second pad along a respective line connecting the centroids of the first and second pads, wherein the lines of the first plurality of pairs of differential signal solder pads are generally parallel to each other, and a second plurality of pairs of differential signal solder pads, wherein each pair of differential signal solder pads of the second plurality of differential signal solder pads includes a third pad separated from a fourth pad along a respective line connecting the centroids of respective third and fourth solder pads, wherein the lines of the second plurality of pairs of differential signal solder pads are generally parallel to each other and generally perpendicular to the lines of the first plurality of pairs of differential signal solder pads.

Example 14 may include or use, or may optionally be combined with the subject matter of Example 12 to include or use, a first plurality of pairs of differential signal vias, wherein each pair of differential signal vias of the first plurality of differential signal vias includes a first via electrically coupled to a respective first pad of the first plurality of pairs of differential signal solder pads and a second via electrically coupled to a respective second pad of the first plurality of pairs of differential signal solder pads, the first via separated from the second via along a respective line connecting the centroids of the first and second vias, wherein the lines of the first plurality of pairs of differential signal vias are generally parallel to each other and the lines of the first plurality of pairs of differential signal solder pads.

Example 15 may include or use, or may optionally be combined with the subject matter of Example 14 to include or use a second plurality of pairs of differential signal vias, wherein each pair of differential signal vias of the second plurality of differential signal vias includes a third via electrically coupled to a respective third pad of the second plurality of pairs of differential signal solder pads and a fourth via electrically coupled to a respective fourth pad of the second plurality of pairs of differential signal solder pads, the third via separated from the fourth via along a respective line connecting the centroids of the third and fourth vias, wherein the lines of the second plurality of pairs of differential signal vias are generally parallel to each other and the lines of the second plurality of pairs of differential signal solder pads, and perpendicular to the lines of the first plurality of pairs of differential signal solder pads.

Example 16 may include or use, or may optionally be combined with the subject matter of at least one of Examples 13-15 to include or use, wherein the first plurality of pairs of differential signal solder pads are on a first layer of the PCB and wherein the PCB includes a second layer including a ground plane.

Example 17 may include or use subject matter (such as an apparatus, a method, a means for performing acts, or a device readable memory including instructions that, when performed by the device, may cause the device to perform acts), such as may include or use a printed circuit board (PCB) including a first pair of differential signal solder pads comprising a first solder pad and a second solder pad proximate the first solder pad, the first solder pad and the second solder pad separated from each other along a first line and a second pair of differential signal solder pads comprising a third solder pad proximate a fourth solder pad, the third solder pad and the fourth solder pad separated from each other along a second line generally perpendicular to the first line, and a package including a differential signal pinout electrically connected to the first pair of differential signal solder pads and the second pair of differential signal solder pads.

Example 18 may include or use, or may optionally be combined with the subject matter of Example 17 to include or use, wherein the PCB further includes a third pair of differential signal solder pads comprising a fifth solder pad proximate a sixth solder pad, the fifth solder pad and the sixth solder pad separated from each other along a third line generally parallel to the first line and generally perpendicular to the second line, and the pinout of the package is electrically connected to the third pair of differential signal solder pads.

Example 19 may include or use, or may optionally be combined with the subject matter of Example 18 to include or use, wherein the PCB further includes a fourth pair of differential signal solder pads comprising a seventh solder pad proximate an eighth solder pad, the seventh solder pad and the eighth solder pad separated from each other along a fourth line generally perpendicular to the first line, generally parallel to the second line, and generally perpendicular to the third line, and the pinout of the package is electrically connected to the third pair of differential signal solder pads.

Example 20 may include or use, or may optionally be combined with the subject matter of Example 17 to include or use, wherein the PCB further includes a pair of differential signal vias including a first via and a second via, wherein the first and second vias are separated from each other along a line parallel to the first line and wherein the first via is electrically coupled to the first solder pad and the second via is electrically coupled to the second solder pad.

The above detailed description includes references to the accompanying drawings, which form a part of the detailed description. The drawings show, by way of illustration, specific embodiments in which methods, apparatuses, and systems discussed herein may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A device comprising:
    a first pair of differential signal lines comprising a first signal line and a second signal line proximate the first signal line, the first signal line and the second signal line separated from each other along a first line;
    a second pair of differential signal lines comprising a third signal line proximate a fourth signal line, the third signal line and the fourth signal line separated from each other along a second line generally perpendicular to the first line;
    a third pair of differential signal lines including a fifth signal line electrically coupled to the first signal line and a sixth signal line electrically coupled to the second signal line, wherein the fifth and sixth signal lines are separated from each other along a line parallel to the first line; and
    a fourth pair of differential signal lines including a seventh signal line electrically coupled to the third signal line and an eighth signal line electrically coupled to the fourth signal line, wherein the seventh and eighth signal lines are separated from each other along a line parallel to the second line;
    wherein the first second, third and fourth airs of differential signal lines are on a same surface of the device.

2. The device of claim 1 wherein, the first line connects the centroids of the first and second signal lines and intersects the second line between the third and fourth signal lines.

3. The device of claim 1, further comprising one or more ground signal lines situated in a region between the first and second and third and fourth pairs of differential signal lines.

4. The device of claim 1, wherein the device includes a memory device.

5. The device of claim 1, wherein the first and second pairs of differential signal lines are configured in a Ball Grid Array (BGA) pinout pattern.

6. The device of claim 1, wherein the first pair of differential signal lines are first and second vias.

7. The device of claim 1, wherein the first pair of differential signal lines are first and second solder pads.

8. A printed circuit board (PCB) comprising:
    a first plurality of pairs of differential signal solder pads, wherein each pair of differential signal solder pads of the first plurality of differential signal solder pads includes a first pad separated from a second pad along a respective line connecting the centroids of the first and second pads, wherein the lines of the first plurality of pairs of differential signal solder pads are generally parallel to each other;
    a second plurality of pairs of differential signal solder pads, wherein each pair of differential signal solder pads of the second plurality of differential signal solder pads includes a third pad separated from a fourth pad along a respective line connecting the centroids of respective third and fourth solder pads, wherein the lines of the second plurality of pairs of differential signal solder pads are generally parallel to each other and generally perpendicular to the lines of the first plurality of pairs of differential signal solder pads;
    a third plurality of pairs of differential signal solder pads, wherein each pair of differential signal solder pads of the third plurality of differential signal solder pads includes a fifth pad separated from a sixth pad along a respective line connecting the centroids of the fifth and sixth pads, wherein the lines of the third plurality of pairs of differential signal solder pads are generally parallel to the lines of the first plurality of pairs of difference signals, each of the fifth pads electrically connected to a respective first pad and each of the sixth pads electrically connected to a respective second pad; and
    a fourth plurality of pairs of differentials signal solder pads, wherein each pair of differential signal solder pads of the fourth plurality of differential signal solder pads includes a seventh pad separated from an eighth pad along a respective line connecting the centroids of the seventh and eighth pads, wherein the lines of the fourth plurality of pairs of differential signal solder pads are generally parallel to the lines of the second plurality of pairs of differential signal lines, each of the seventh pads electrically connected to a respective third pad and each of the eighth pads electrically connected to a respective fourth pad wherein the first, second, third, and fourth plurality pairs of differential signal solder pads are on a same surface of the PCB.

9. The PCB of claim 8, further comprising a first plurality of pairs of differential signal vias, wherein each pair of differential signal vias of the first plurality of differential signal vias includes a first via electrically coupled to a respective first pad of the first plurality of pairs of differential signal solder pads and a second via electrically coupled to a respective second pad of the first plurality of pairs of differential signal solder pads, the first via separated from the second via along a respective line connecting the centroids of the first and second vias, wherein the lines of the first plurality of pairs of differential signal vias are generally parallel to each other and the lines of the first plurality of pairs of differential signal solder pads.

10. The PCB of claim 9, further comprising a second plurality of pairs of differential signal vias, wherein each pair of differential signal vias of the second plurality of differential signal vias includes a third via electrically coupled to a respective third pad of the second plurality of pairs of differential signal solder pads and a fourth via electrically coupled to a respective fourth pad of the second plurality of pairs of differential signal solder pads, the third via separated from the fourth via along a respective line connecting the centroids of the third and fourth vias, wherein the lines of the second plurality of pairs of differential signal vias are generally parallel to each other and the lines of the second plurality of pairs of differential signal solder pads, and perpendicular to the lines of the first plurality of pairs of differential signal solder pads.

11. The PCB of claim 10, wherein the first plurality of pairs of differential signal solder pads are on a first layer of the PCB and wherein the PCB includes a second layer including a ground plane.

12. A system comprising:
   a printed circuit board (PCB) including:
      a first pair of differential signal solder pads comprising a first solder pad and a second solder pad proximate the first solder pad, the first solder pad and the second solder pad separated from each other along a first line;
      a second pair of differential signal solder pads comprising a third solder pad proximate a fourth solder pad, the third solder pad and the fourth solder pad separated from each other along a second line generally perpendicular to the first line;
      a third pair of differential signal solder pads comprising a fifth solder pad proximate a sixth solder pad, the fifth solder pad electrically coupled to the first solder pad and the sixth solder pad electrically coupled to the second solder pad, wherein the fifth and sixth solder pads are separated from each other along a third line parallel to the first line; and
      a fourth pair of differential signal solder pads comprising a seventh solder pad proximate an eighth solder pad electrically coupled to the second solder pad, wherein the fifth and sixth solder pad and the eighth solder pad electrically coupled to the fourth solder pad, wherein the seventh and eighth solder are separated from each other along a fourth line parallel to the second line;
     wherein the first, second third, and fourth pairs of differential signal solder ads are on a same surface of the PCB; and
   a package including a differential signal pinout electrically connected to the first pair of differential signal solder pads and the second pair of differential signal solder pads.

13. The system of claim 12, wherein the PCB further includes a pair of differential signal vias including a first via and a second via, wherein the first and second vias are separated from each other along a line parallel to the first line and wherein the first via is electrically coupled to the first solder pad and the second via is electrically coupled to the second solder pad.

* * * * *

UNITED STATES PATENT AND TRADEMARK OFFICE
CERTIFICATE OF CORRECTION

PATENT NO. : 9,554,454 B2  
APPLICATION NO. : 14/573434  
DATED : January 24, 2017  
INVENTOR(S) : Zhao et al.

Page 1 of 1

It is certified that error appears in the above-identified patent and that said Letters Patent is hereby corrected as shown below:

In the Claims

In Column 13, Line 57, in Claim 1, delete "first second, third and fourth airs" and insert --first, second, third, and fourth pairs-- therefor In Column 14, Line 35, in Claim 8, delete "difference signals," and insert --differential signal lines,-- therefor In Column 14, Line 39, in Claim 8, delete "differentials" and insert --differential-- therefor

In Column 14, Line 50-52, in Claim 8, delete "pad wherein the first, second, third, and fourth plurality pairs of differential signal solder pads are on a same surface of the PCB." and insert --pad.-- therefor In Column 16, Line 3, in Claim 12, delete "fifth" and insert --first-- therefor In Column 16, Line 8-15, in Claim 12, delete "a fourth pair of differential signal solder pads comprising a seventh solder pad proximate an eighth solder pad electrically coupled to the second solder pad, wherein the fifth and sixth solder pad and the eighth solder pad electrically coupled to the fourth solder pad, wherein the seventh and eighth solder are separated from each other along a fourth line parallel to the second line;" and insert --a fourth pair of differential signal solder pads comprising a seventh solder pad proximate an eighth solder pad, the seventh solder pad electrically coupled to the third solder pad and the eighth solder pad electrically coupled to the fourth solder pad, wherein the seventh and eighth solder are separated from each other along a fourth line parallel to the second line;-- therefor In Column 16, Line 17, in Claim 12, delete "ads" and insert --pads-- therefor Signed and Sealed this  
Twenty-sixth Day of May, 2020

Andrei Iancu  
*Director of the United States Patent and Trademark Office*